United States Patent
Katsis et al.

(10) Patent No.: US 7,952,507 B2
(45) Date of Patent: May 31, 2011

(54) PROGRAMMABLE SEGMENTED DIGITAL-TO-ANALOG CONVERTER (DAC)

(75) Inventors: Dimitrios Katsis, Emeryville, CA (US); Barry Concklin, San Jose, CA (US)

(73) Assignee: Intersil Americas Inc., Milpitas, CA (US)

(*) Notice: Subject to any disclaimer, the term of this patent is extended or adjusted under 35 U.S.C. 154(b) by 0 days.

(21) Appl. No.: 12/607,929

(22) Filed: Oct. 28, 2009

(65) Prior Publication Data

US 2011/0006934 A1 Jan. 13, 2011

Related U.S. Application Data

(60) Provisional application No. 61/224,373, filed on Jul. 9, 2009.

(51) Int. Cl.
*H03M 1/66* (2006.01)
(52) U.S. Cl. .................................. 341/144; 341/120
(58) Field of Classification Search .................. 341/144, 341/120, 145, 118
See application file for complete search history.

(56) References Cited

U.S. PATENT DOCUMENTS

| | | | |
|---|---|---|---|
| 6,489,905 B1 | 12/2002 | Lee et al. | |
| 6,507,296 B1 * | 1/2003 | Lee et al. | 341/120 |
| 6,646,580 B2 * | 11/2003 | Clara et al. | 341/136 |
| 6,917,316 B2 * | 7/2005 | Blackburn | 341/118 |
| 7,053,805 B2 * | 5/2006 | Chang et al. | 341/120 |
| 7,511,771 B2 | 3/2009 | Stern et al. | |
| 7,583,216 B2 | 9/2009 | Felder et al. | |
| 2009/0128784 A1 | 5/2009 | Yoon | |

* cited by examiner

*Primary Examiner* — Brian Young
(74) *Attorney, Agent, or Firm* — Fliesler Meyer LLP

(57) ABSTRACT

Provided herein are segmented digital to analog converters (DACs), methods for use therewith, and systems that include one or more such DACs. According to an embodiment, a DAC includes a plurality of sub-DACs, a DAC input adapted to receive a multi-bit digital input and a DAC output adapted to output an analog output current in response to and indicative of the digital input. Each sub-DAC is adapted to receive a separate reference current that specifies a transfer function of the sub-DAC. A magnitude of the reference current provided to each sub-DAC is separately programmable to thereby separately control a gain of each sub-DAC.

24 Claims, 4 Drawing Sheets

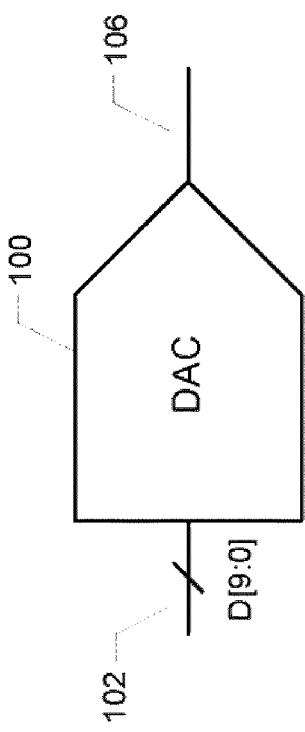
FIG. 1
(PRIOR ART)
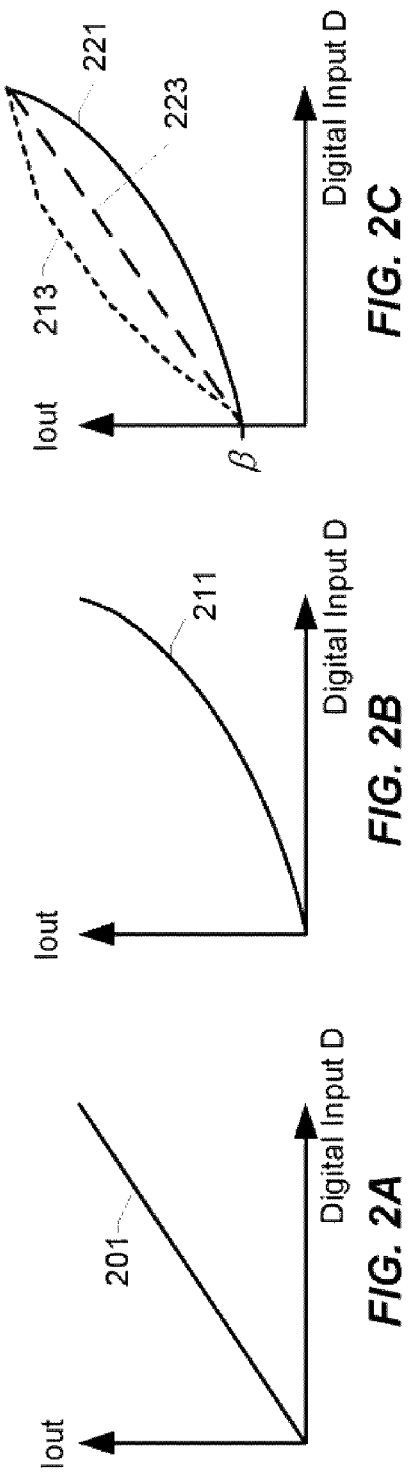
FIG. 2A
FIG. 2B
FIG. 2C

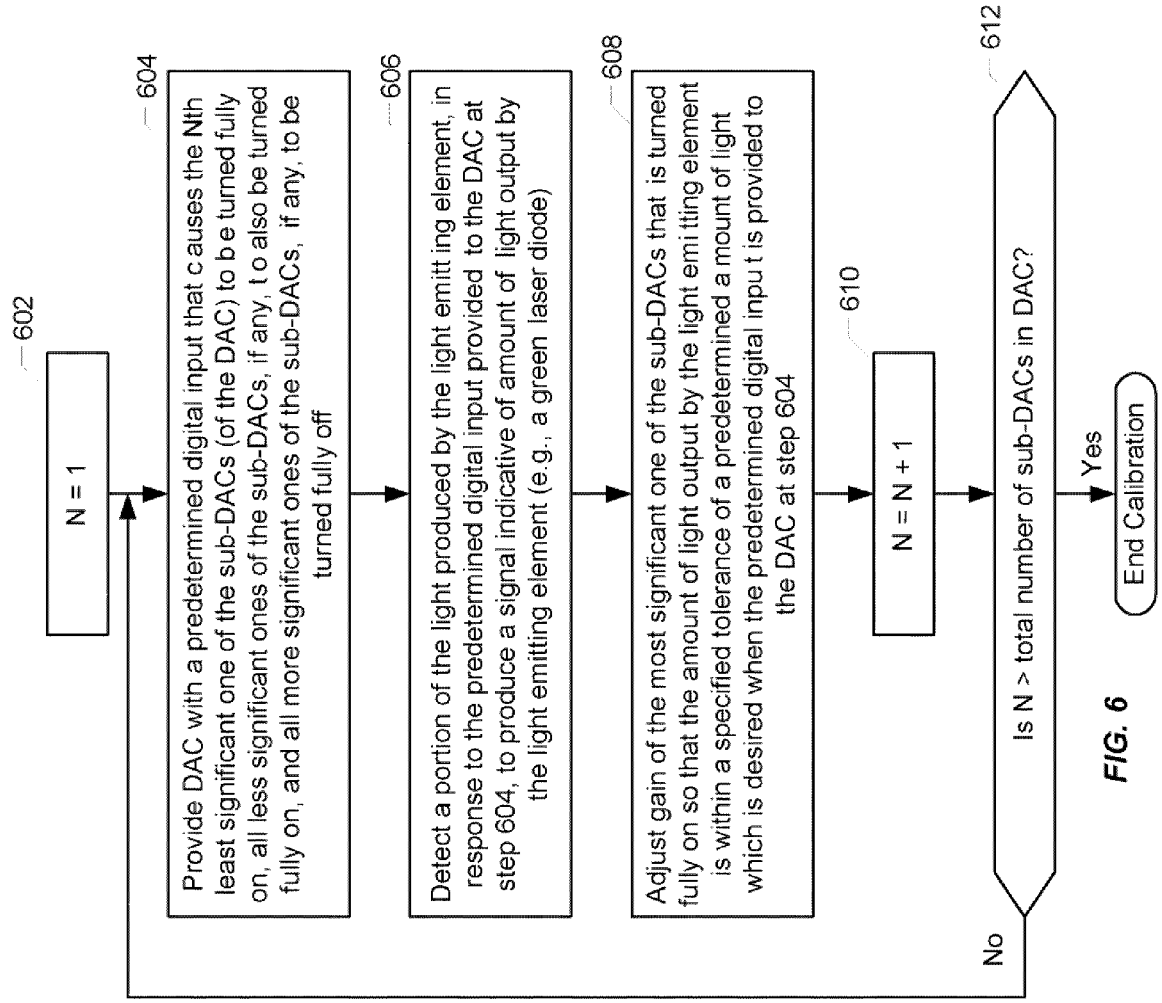
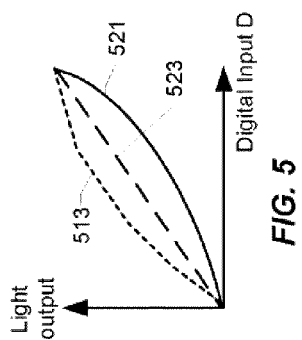
FIG. 5
FIG. 6

PROGRAMMABLE SEGMENTED DIGITAL-TO-ANALOG CONVERTER (DAC)

PRIORITY CLAIM AND RELATED APPLICATION

This application claims priority under 35 U.S.C. 119(e) to U.S. Provisional Patent Application No. 61/224,373, entitled "Programmable Segmented Digital-to-Analog Converter (DAC)", filed Jul. 9, 2009, which is incorporated herein by reference.

This application is related to commonly invented and commonly assigned U.S. patent application Ser. No. 12/607,924, entitled "Data Look Ahead To Reduce Power Consumption", filed the same day as the present application, and which is incorporated herein by reference.

BACKGROUND

FIG. 1 illustrates a current digital-to-analog converter (DAC) 100 that accepts a multi-bit digital input signal 102, and outputs an analog current 106 indicative of the digital input signal 102. In FIG. 1 the DAC 100 is shown as receiving 10 bits, labeled D[9:0], where bit position 0 is the least significant bit (LSB) and bit position 9 is the most significant bit (MSB). Thus, the DAC 100 can be referred to as a 10-bit DAC, or equivalently as a DAC having 10-bits of resolution. While DAC 100 is shown as having 10 bits of resolution, more or less bits can be used, depending upon the desired resolution of the DAC.

FIGS. 2A and 2B illustrate exemplary transfer functions for a DAC, also referred to as DAC transfer functions. More specifically, FIG. 2A illustrates a linear DAC transfer function 201, and FIG. 2B illustrates a non-linear DAC transfer function 211. The non-linearity of the transfer function shown in FIG. 2B can be due to component and/or current mismatches as well as other non-idealities within the DAC, as will be appreciated from the discussion below.

The current DAC 100 (which will simply be referred to hereafter as "the DAC") can be implemented using multiple current sources, as is well known in the art. For example, the 10-bit DAC 100 can include (2^10)−1 (i.e., 1023) equally weighted current sources, which are selectively turned on and off based on the digital input D[9:0], such that 2^10 (i.e., 1024) different analog current levels can be produced at the output of the DAC. Alternatively, less current sources can be used where the current sources are appropriately differently weighted. For example, as few as 10 differently weighted current sources may be used, each of which is controlled by one of the 10 bits. Many variations of this are possible, as is well known in the art.

One type of DAC is known as a segmented DAC, because it essentially includes a plurality of sub-DACs that form the larger DAC. There are numerous ways to implement a segmented DAC, not all of which are described herein. Typically each sub-DAC will receive at least some of the bits of the digital data input (e.g., D[9:0]) and generate a current output in response to the digital input. The currents output by the plurality of sub-DACs are typically added to produce the output of the larger DAC. Each sub-DAC can receive a corresponding reference current Iref that is used by the sub-DAC to calibrate the internal current sources (within the sub-DAC) that are used to convert a digital input to an analog output. The various reference currents Iref can be automatically adjusted, e.g., using feedback and/or a master reference current, in an attempt to compensate for component and current mismatches between the sub-DACs, to attempt to cause the larger DAC to be substantially linear (e.g., so that transfer function of the larger DAC resembles line 201 in FIG. 2A).

The above described segmented DACs are useful where the desire is to provide a DAC having a substantially linear DAC transfer function. However, that may not always be the desire.

SUMMARY

A segmented digital to analog converter (DAC), according to an embodiment of the present invention, includes a plurality of sub-DACs, a DAC input adapted to receive a multi-bit digital input and a DAC output adapted to output an analog output current in response to and indicative of the digital input. Each sub-DAC is adapted to receive a separate reference current that specifies a transfer function of the sub-DAC. A magnitude of the reference current provided to each sub-DAC is separately programmable to thereby separately control a gain of each sub-DAC.

In accordance with an embodiment, the segmented DAC, also simply referred to as the DAC, further includes a separate gain-DAC corresponding to each of the plurality of sub-DACs. Each gain-DAC provides the reference current to its corresponding sub-DAC. In an embodiment, each gain-DAC receives at its input a digital value that specifies the magnitude of the reference current that the gain-DAC provides to its corresponding sub-DAC.

In accordance with an embodiment, the DAC also includes registers adapted to store a separate digital value for each of the gain-DACs. These stored digital values are used by the gain-DACs to generate the reference currents that are provided to the sub-DACs. A change to a digital value stored for one of the gain-DACs changes the reference current produced by the one of the gain-DACs, which changes the gain of the sub-DAC that receives the changed reference current. This enables a transfer function of the DAC to be modified in a piece-wise linear manner by modifying one or more of the digital values stored in the registers, which modifies one or more of the reference currents provided by the gain-DACs to the sub-DACs.

Embodiments of the present invention are also directed to methods for performing a digital to analog conversion using a digital to analog converter (DAC) including a plurality of sub-DACs. Such a method can include specifying a transfer function of each of the sub-DACs by providing a separate reference current to each of the sub-DACs, wherein a magnitude of the reference current provided to each sub-DAC is separately programmable. The method can also include receiving, at an input of the DAC, a multi-bit digital input. One or more of the sub-DACs, or portions thereof, are selectively turned based on the received digital input, to thereby produce one or more currents at outputs of the sub-DACs. At an output of the DAC, an analog output indicative of the digital input is produced by combining the currents produced by the sub-DACs. The method can also include storing a separately programmable digital value for each of the sub-DACs, and separately producing each of the reference currents by separately converting each of the programmable digital values into one of the reference currents. Additionally, the method can include modifying the piece-wise linear transfer function of the DAC by modifying one or more of the separately programmable digital values.

Embodiments of the present invention are also directed to systems that include one or more segmented DACs. In accordance with an embodiment, a system includes a plurality of DACs, each of which is adapted to receive a separate multi-bit digital input and output a separate analog output current in response to and indicative of the digital input received by the DAC. The system also includes a plurality of a light emitting elements, each of which produces light of a different wavelength (e.g., a red laser diode, a green laser diode and a blue laser diode), and each of which is adapted to be driven in dependence on one of the analog output currents output by one of the DACs. At least one of the DACs includes a plurality of sub-DACs (i.e., is a segmented DAC), where currents output by the sub-DACs are combined to provide the analog output current that is output by that DAC. Each sub-DAC is adapted to receive a separate reference current that specifies a transfer function of the sub-DAC, wherein a magnitude of the reference current provided to each sub-DAC is separately programmable to thereby separately control a gain of each sub-DAC. The system can also include one or more photo-detectors adapted to detect a portion of the light produced by at least one of the light emitting elements (e.g., a green laser diode) and to produce a signal indicative of the light output by the light emitting element.

Embodiments of the present invention are also directed to a method for performing a calibration of a system that includes a DAC including a plurality of sub-DACs, a light emitting element and at least one photo-detector. The DAC is adapted to receive a multi-bit digital input and to output an analog output current in response to and indicative of the digital input received by the DAC. Currents output by the sub-DACs are combined to provide the analog output current that is output by the DAC. The light emitting element is adapted to be driven in dependence on the analog output current output by the DAC. In an embodiment, such a method includes providing the DAC with a predetermined digital input that causes at least one of the sub-DACs to be turned fully on, all less significant ones of the sub-DACs, if any, to also be turned fully on, and all more significant ones of the sub-DACs, if any, to be turned fully off. A portion of the light produced by the light emitting element, in response to the predetermined digital input provided to the DAC, is detected to produce a signal indicative of an amount of light output by the light emitting element. A gain of the most significant one of the sub-DACs that is turned fully on is adjusted so that the amount of light output by the light emitting element is within a specified tolerance of a predetermined amount of light which is desired when the predetermined digital input is provided to the DAC. Such steps are preformed for each of the sub-DACs of the DAC each time a calibration of the system is to be performed.

In accordance with an embodiment, a first time the aforementioned steps are performed, during a calibration, only the least significant one of the sub-DACs is turned fully on and all of the more significant ones of the sub-DACs are turned fully off. A second time the steps are performed, during the calibration, only the first and second least significant ones of the sub-DACs are turned fully on and all of the more significant ones of the sub-DACs are turned fully off. . . . A Mth time the steps are performed, during the calibration, the M least significant ones of the sub-DACs are turned fully on and all of the more significant ones of the sub-DACs are turned fully off. . . . . A last time the steps are performed, during the calibration, all of the sub-DACs are turned fully on. In accordance with an embodiment, the predetermined digital inputs provided to the DAC during the calibration are programmed into the system. Such a calibration can be performed automatically by the system, e.g., during blanking periods of a video signal provided to the system.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

FIG. 1 is a high level representation of a current digital-to-analog converter (DAC) 100.

FIG. 2A illustrates an exemplary linear DAC transfer function.

FIG. 2B illustrates an exemplary nonlinear DAC transfer function.

FIG. 2C is used to illustrate how embodiments of the present invention can be used to compensate for the non-linearity of a load and/or system, to effectively achieve a substantially linear combined transfer function.

FIG. 5 is useful for explaining a calibration procedure according to an embodiment of the present invention.

FIG. 6 is a high level flow diagram that summarizes a calibration procedure according to an embodiment of the present invention.

DETAILED DESCRIPTION

As mentioned above, the various reference currents provided to sub-DACs of a segmented DAC can be automatically adjusted (e.g., using feedback and/or a master reference current) in an attempt to compensate for component and current mismatches between the sub-DACs, to cause the larger DAC to be substantially linear (e.g., so that transfer function of the larger DAC resembles line 201 in FIG. 2A). While that may be useful to provide a DAC having a substantially linear DAC transfer function, such a transfer function may not always be desired. For example, where a load (e.g., a green laser diode) that is being driven by a DAC has a non-linear transfer function, then the desire may be to specify a non-linear DAC transfer function that compensates for the non-linearity of the load being driven, to effectively cause the DAC and the load to collectively operate in a substantially linear manner. This can be appreciated from FIG. 2C. Referring to FIG. 2C, assume a load's transfer function is represented by line 221, but the desire is that the load functions in a linear manner in response to a digital input signal. To achieve this, the desired DAC transfer function may resemble line 213, so that the effective transfer function of the DAC in combination with the load resembles line 223 in FIG. 2C. Embodiments of the present invention, described below, can be used to purposely achieve a DAC transfer function resembling line 213, or some other desired transfer function. More generally, embodiments of the present invention described below enable a DAC transfer function to be programmed or otherwise controlled to achieve multiple different transfer functions.

Figure 3:
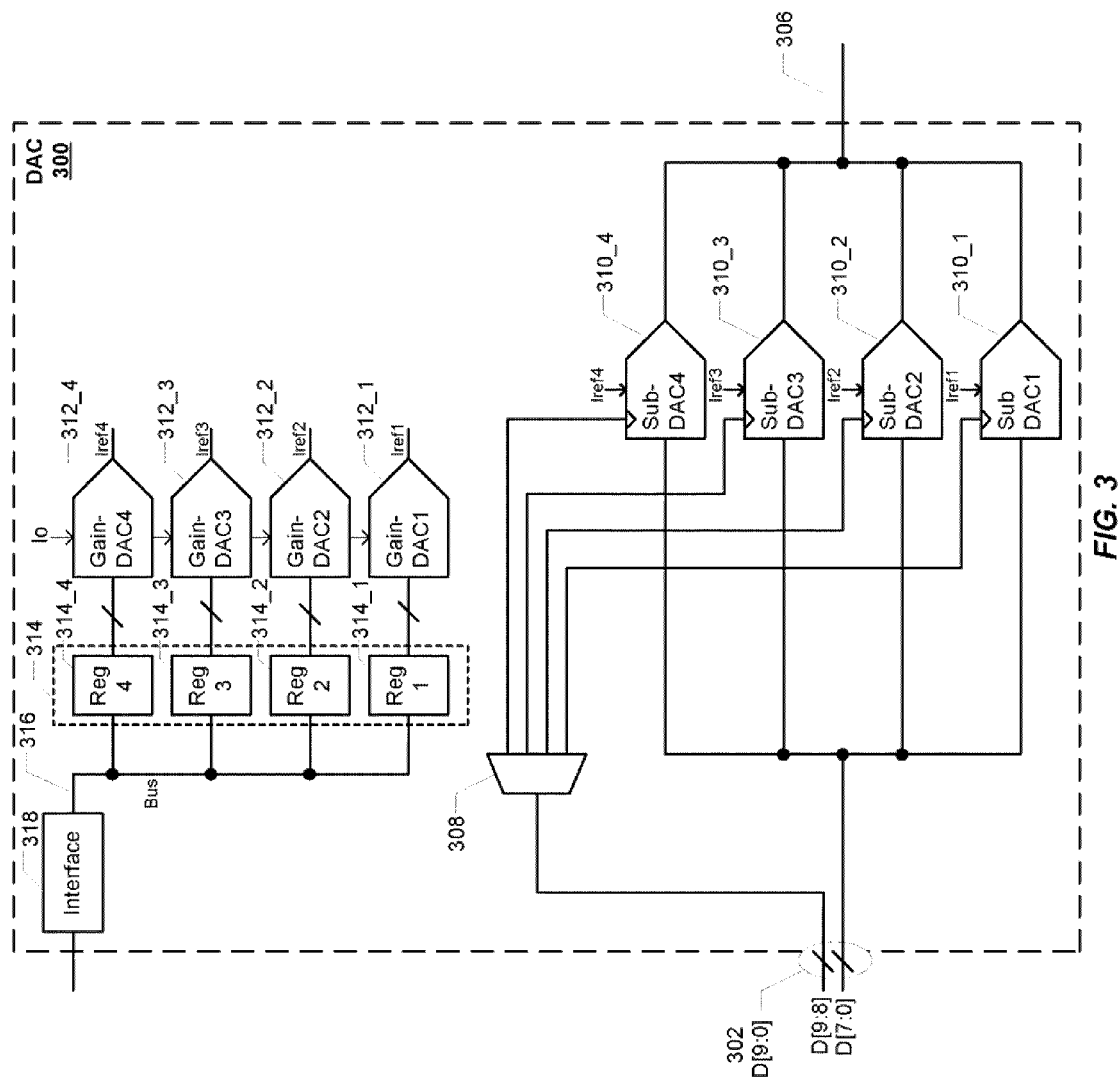
FIG. 3 is a high level diagram of a segmented current DAC according to an embodiment of the present invention.

FIG. 3 illustrates a segmented DAC 300, according to an embodiment of the present invention. While the segmented DAC 300 is shown as including four sub-DACs 310_1, 310_2, 310_3 and 310_4, more or less sub-DACs can be used. The sub-DACs may also be referred to as output sub-DACs, since they are being used to generate an analog output 306 of the larger DAC 300, in response to a digital input 302.

Still referring to FIG. 3, the DAC 300 also includes a decoder 308, which can be a thermometer decoder, but is not limited thereto. In accordance with an embodiment, the decoder 308 receives the log 2(N sub-DACs) MSBs of the digital input signal 302. Thus, because in this example there are four sub-DACs, the decoder 308 receives the two MSBs D[9:8] of signal 302 (because the log 2(4)=2). The remaining bits D[7:0] are provided to the inputs of each of the four sub-DACs 310.

In FIG. 3, the decoder 308 decodes the two MSBs D[9:8] to determine which sub-DACs should be fully on, partially on, or fully off. As the terms are used herein: a fully on sub-DAC produces a current at its output by switching to the output (of the sub-DAC) all of the current sources within the sub-DAC; a partially on sub-DAC produces a current at its output by switching to the output (of the sub-DAC) only some of the current sources within the sub-DAC; and a fully off sub-DAC produces no current at the output (of the sub-DAC) by not switching any of its current sources to the output of the sub-DAC. In the embodiment shown, the most significant sub-DAC 310 selected by the decoder 308 is at least partially on (but can potentially be fully on, depending on D[7:0]). All of the less significant sub-DACs (if any) will be fully on, and all of the more significant sub-DACs (if any) will by fully off.

As mentioned above, all of the sub-DACs 310 receive the bits not provided to the decoder 308. Thus, in FIG. 3, all of the sub-DACs receive the eight LSBs D[7:0]. The fully on sub-DAC(s) will essentially ignore the eight LSBs, because all the current sources within a fully on sub-DAC will be switched to the output of the sub-DAC regardless of the values of the eight LSBs. The fully off sub-DAC(s) will also essentially ignore the eight LSBs, because all the current sources within a fully off sub-DAC will not be switched to the output of the sub-DAC regardless of the values of the eight LSBs. However, the most significant sub-DAC turned on, which can be partially on (or fully on), uses the eight LSBs D[7:0] to determine which current sources within the sub-DAC should be selectively switched to the output of the sub-DAC.

As also shown in FIG. 3, each of the sub-DACs 310_1, 310_2, 310_3 and 310_4 receives a corresponding reference current Irefx, labeled Iref1, Iref2, Iref3 and Iref4, respectively. In accordance with embodiments of the present invention, each reference current is programmable or otherwise controllable, so that the DAC transfer function of DAC 300 can be controlled by separately controlling the transfer function (and thus, the gain) of each sub-DAC 310.

In specific embodiments, as shown in FIG. 3, each of the reference currents is generated using a corresponding gain-DAC 312 that receives a digital value from one or more corresponding register(s) 314, or portions thereof. For simplicity, it will be assumed that each gain-DAC 312 receives a digital value from a corresponding gain control register 314_1, 314_2, 314_3 and 314_4, collectively referred to as gain control registers 314. The gain control registers 314 are shown as being connected to a bus 316, which is connected to an interface 318, that enables the programming of the registers 314. The interface 318 can be, e.g., a serial to parallel interface or a parallel to parallel interface, but is not limited thereto.

Assuming that Irefx is produced at the output of a gain-DAC 314_x (also referred to as gain_DACx), and that each gain-DAC receives substantially the same reference current Io, then an exemplary transfer function of each gain-DACx can be Irefx=(reg_value_x)*Io. Io can be produced, e.g., using a single current source, and multiple versions of Io can be replicated using one or more current mirrors. Assuming that the transfer function of a partially on sub-DACx is Ioutx=Irefx*Dx, where Dx is the digital input to the sub-DACx (e.g., Dx can be D[7:0]), then the transfer function of a partially on sub_DACx can be rewritten as Ioutx=(reg_value_x)*Io*(the actual digital input to the sub-DACx). The transfer function of a fully on sub_DACx could similarly be expressed as Ioutx=(reg_value_x)*Io*(the maximum digital input to the sub-DACx), since all the current sources within a fully on sub-DAC will be switched to the output of the sub-DAC regardless of the digital input to the sub-DAC. The transfer function of a fully off sub_DACx could simply be Ioutx=0, since all the current sources within a fully off sub-DAC will not be switched to the output of the sub-DAC regardless of the digital input to the sub-DAC.

To add an offset $\beta$ to the above transfer function, an additional offset sub-DAC (not shown) can be added, which receives an offset value (reg_value_$\beta$) input from an offset register. Such a register can be programmed, e.g., via the bus 316 and interface 318. Such an offset sub-DAC can be within the DAC 300, or external the DAC 300. Where such an offset sub-DAC is used to provide a threshold current to a laser diode, the offset sub-DAC may be referred to as a threshold-DAC.

In the above described manner, a desired piecewise linear DAC can be achieved, where each sub-DAC (e.g., 310) has a substantially linear transfer function, but the larger DAC (e.g., 300) can have a desired non-linear (but continuous) transfer function. As can be appreciated from FIG. 2C, embodiments of the present invention can be used to purposefully produce a nonlinear transfer function (e.g., resembling line 213) through adjustments of the reference currents to thereby achieve the inverse of another transfer function (e.g., resembling line 221), to effectively achieve a linear system transfer function (e.g., resembling line 223). The appropriate reference currents can be achieved in various ways, only some of which are mentioned herein. For non-time varying linearities, the reference currents provided to the sub-DACs can be determined empirically, e.g., using lab experiments, and digital values defining the reference currents can be loaded into the DAC (e.g., into the gain control registers 314) after a factory calibration. For relatively slow time varying nonlinearities (e.g., due to aging of a laser diode), reference currents (and more specifically the digital values used to define the same) can be adjusted through a feedback loop, e.g., during a foreground start up calibration. For relatively fast time varying nonlinearities (e.g., due to changes in temperature of a laser diode), reference currents (and more specifically the digital values used to define the same) can be adjusted through a real time calibration (foreground or background).

The DAC 300, and similar programmable DACs in accordance with embodiments of the present invention, can be used in various applications, e.g., in hand-held projectors (that are often referred to as picoprojectors). Embodiments of the present invention provide the capability to externally modify a DAC transfer function, which as described above, can be used to counteract known nonlinearities of a load (e.g., laser diode) being driven using the DAC, as well as other system nonlinearities. Additionally, embodiments of the present invention provide the capability to automatically calibrate a DAC transfer function to compensate for potentially time varying nonlinearities. Further, as will be described below, embodiments of the present invention can also be used to enable power savings.

Embodiments of the present invention enable piecewise linearization to be performed in the analog domain, thereby avoiding resolution loss that would otherwise result if linearization took place in the digital domain. In particular, pre-distorting the digital input to a DAC to counteract potential nonlinearities, would effectively reduce the available resolution of the DAC, since part of the available resolution would be allocated to pre-distortion. Embodiments of the present invention can be used to avoid any necessity of such pre-distortion. Nevertheless, embodiments of the present invention are also useful where pre-distortion is performed.

In FIG. 3, the DAC 300 can be thought of as being divided into four segments, where each segment includes a sub-DAC 310, a corresponding gain-DAC 312 and a corresponding portion of the gain control registers 314 that specifies the value provided to the gain-DAC. While the DAC 300 was shown to including four segments, other numbers of segments can be used. For example, in a specific embodiment, the DAC 300 includes sixteen segments (and thus, sixteen sub-DACs and sixteen gain-DACs).

Splitting a DAC (e.g., 300) into multiple (N) segments to create the piecewise linear functionality effectively splits the power intensive support circuitry required to drive the DAC into N segments driving each of the sub-DACs. Since each sub-DAC presents ~1/N of the total DAC load, its supporting circuitry is ~1/N of that required to drive the total DAC, thus creating no more significant area or power overhead compared to conventional segmented DAC schemes. Moreover, splitting the support circuits into N segments enables selective disabling of certain segments (or portions thereof) that are not being used, thereby providing better power efficiency than conventional segmented DAC schemes.

While each gain-DAC 312 is described as being a current DAC, in alternative embodiments each gain-DAC can be a voltage DAC that produces a reference voltage output that is converted to a reference current, e.g., using a transconductance circuit.

In further embodiments, the function of the registers 314 and gain-DACs 312 can be replaced with analog circuitry that provides a separately controlled reference current for each of the sub-DACs. For example, refreshable and controllable sample-and-holds or analog memory cells (e.g., analog non-volatile memory (ANVM) cells), or the like, and corresponding transconductance circuitry can be used to provide a separately controlled reference current for each of the sub-DACs.

Figure 4:
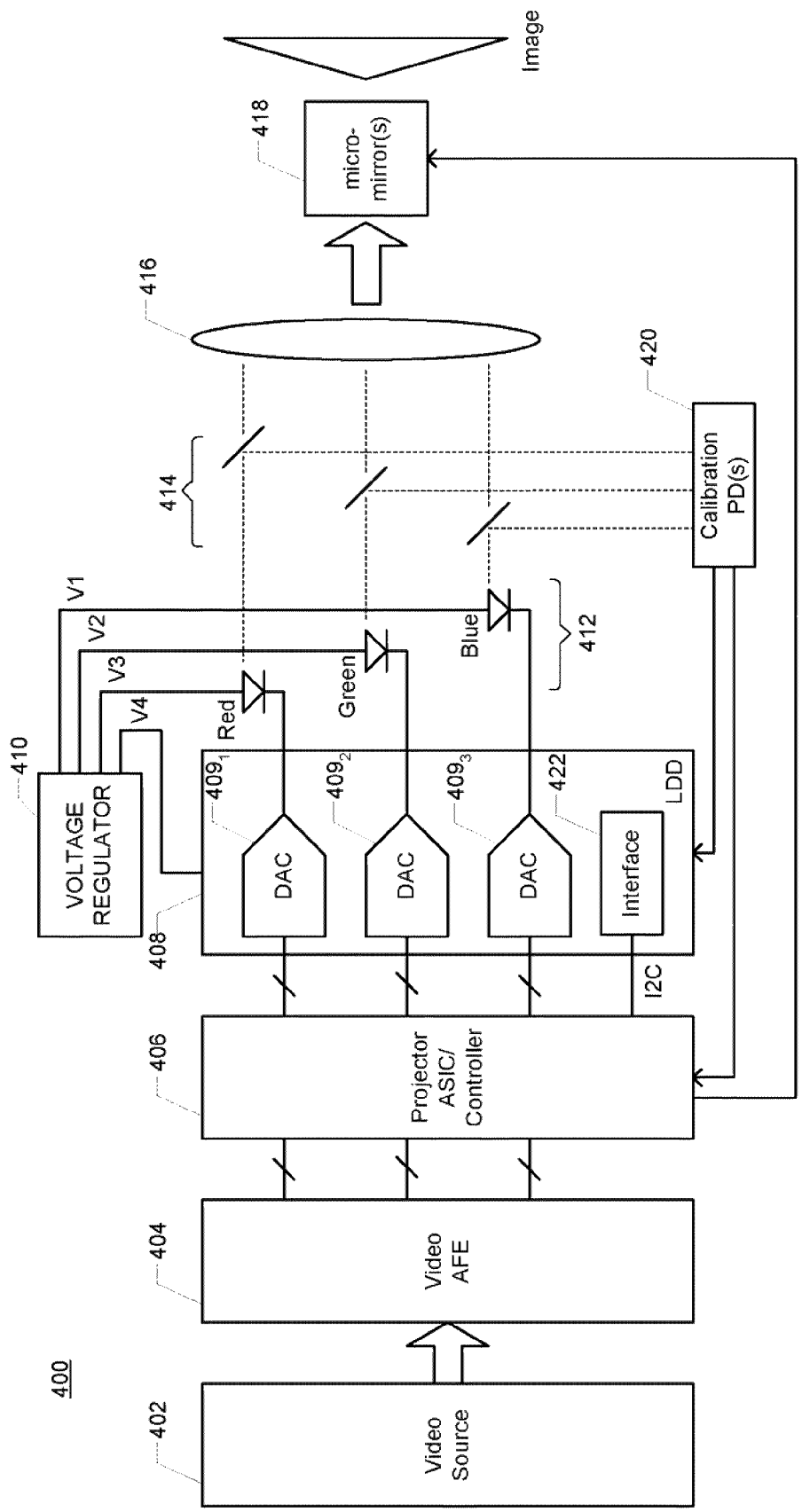
FIG. 4 is a high level diagram of a miniature projector system according to an embodiment of the present invention.

FIG. 4 illustrates an exemplary miniature projector display device 400, according to an embodiment of the present invention, which includes a plurality of DACs 409, one or more of which can be implemented as a programmable segmented DAC 300, described above. The miniature projector device 400 can be integrated with or attached to a portable device, such as, but not limited to, a mobile phone, a smart phone, a portable computer (e.g., a laptop or netbook), a personal data assistant (PDA), or a portable media player (e.g., DVD player). The miniature projector device 400 can alternatively be integrated with or attached to a non-portable device, such as a desktop computer or a media player (e.g., a DVD player), but not limited thereto.

Referring to FIG. 4, the projector display device 400 is shown as including a video source 402, a video analog front end (AFE) 404, a controller 406 (which can be an application specific integrated circuit and/or a micro-controller), a laser diode driver (LDD) 408 and a voltage regulator 410. The video AFE 404 can include, e.g., one or more analog-to-digital converters (ADCs), and may not be needed where the video source is a digital video source. The controller 406 can perform scaling and/or pre-distortion of video signals before such signals are provided to the LDD 408. The voltage regulator 410 (e.g., a quad-output adjustable DC-DC buck-boost regulator) can convert a voltage provided by a voltage source (e.g., a battery or AC supply) into the various voltage levels (e.g., four voltage levels V1, V2, V3 and V4) for powering the various components of the projector display device 400.

The LDD 408 is shown as including three DACs 409 and a data interface 422, which can be, e.g., an Inter-Integrated Circuit (I2C) interface, but is not limited thereto. The LDD 408 also includes registers, and the like, which are not shown. One or more of the DACs 409 can be implemented as a programmable segmented DAC 300 of an embodiment of the present invention, as mentioned above. The DACs 409 of the LDD 408 drive laser diodes 412, which can include, e.g., a red, a green and a blue laser diode, but are not limited thereto. The use of alternative light emitting elements, such as light emitting diodes (LEDs), etc., is also possible. The light produced by the laser diodes 412 or other light emitting elements can be provided to beam splitters 414, which can direct a small percentage of the light toward one or more calibration photo-detectors (PDs) 420, and direct the remainder of the light toward projector optics 416, which include lenses, mirrors, reflection plates and/or the like. The light output by the optics 416 can be provided to one or more micro mirror(s) 418. The mirror(s) 418 can be controlled by the controller 406, or another portion of the system, to raster-scan reflected light onto a surface, e.g., a screen, a wall, the back of a chair, etc.

Laser diodes 412, especially green laser diodes, can exhibit a nonlinear current to light transfer function (e.g., resembling line 221 in FIG. 2C). Further, a signal path of the laser diode driver 408 may exhibit a nonlinear input to output transfer function due to process, power and design constraints. One or more programmable segmented DACs of the present invention can be used to calibrate out these and possibly other system nonlinearities. For example, a programmable segmented DAC 300 can be used to implement the DAC $409_2$ that is used to drive the green laser diode 412.

Referring to FIG. 5, assume that a transfer function of the green laser diode 412 and related portions of the LDD 408 (used to drive the green laser diode 412) is represented by line 521, but the desire is that the light output by the green laser diode is linear (represented by line 523) in response to a digital input signal. To achieve this, the desired DAC transfer function may resemble line 513, so that the effective transfer function of the DAC $409_2$ (and other related portions of the LDD 408) in combination with the green laser diode 412 resembles line 523 in FIG. 5. Embodiments of the present invention, described above, can be used to purposely achieve a DAC transfer function resembling line 513, or some other desired transfer function.

An exemplary calibration procedure will now be described with reference to FIGS. 3, 4 and 5. Again, presume that the desire is to cause the effective transfer function of the LDD 408 in combination with the green laser diode 412 to resemble line 523 in FIG. 5. Referring to FIG. 3, initially the least significant sub-DAC 310_1 (of the DAC $409_2$ implemented as a programmable segmented DAC) is turned fully on, and the more significant sub-DACs 310_2, 310_3, etc. are turned fully off, by providing the appropriate digital signal (e.g., $D[9:0]_{green}$) to the input of the DAC $409_2$. Referring to FIG. 4, this will result in the green laser diode 412 being driven by a current indicated by the digital signal, and one or more calibration PD(s) 420 detecting a portion of the green light as directed toward the PD(s) 420 by one of the beam splitters 414. The output of the calibration PD(s) 420 is provided as feedback to the LDD 408 and/or the controller 406, or a separate calibration block. This feedback can be used to increase or decrease the gain provided by the sub-DAC 310_1, which can be achieved by increasing or decreasing the value within the register(s) 314_1. This has the effect of changing the Iref1 current output by the gain-DAC1 312_1, which provides the reference current Iref1 to the sub-DAC 310_1. Such adjustments to the gain provided by the sub-DAC 310_1 are made in an effort to cause the light output by the green laser diode 412 to be within a specified tolerance of a predetermined amount of light which is desired when that specific digital signal is provided to the input of the DAC $409_2$. In other words, the gain of the sub-DAC 310_1 can be adjusted so the light output by the green laser diode in response to the predetermined digital signal input to the DAC falls on line 523 in FIG. 5.

Next, the two least significant sub-DACs 310_1 and 310_2 (of the DAC $409_2$ implemented as a programmable segmented DAC) are turned fully on, and the more significant sub-DACs 310_3, etc. are turned fully off, by providing the appropriate digital signal (e.g., $D[9:0]_{green}$) to the input of the DAC $409_2$. This will result in the green laser diode 412 being driven by a current indicated by the digital signal, and one or more calibration PD(s) 420 detecting a portion of the green light as directed toward the PD(s) 420 by one of the beam splitters 414. The output of the calibration PD(s) 420 is provided as feedback to the LDD 408 and/or the controller 406, or a separate calibration block. This feedback can be used to increase or decrease the gain provided by the sub-DAC 310_2, which can be achieved by increasing or decreasing the value within the register(s) 314_2. This has the effect of changing the Iref2 current output by the gain-DAC1 312_2, which provides the reference current Iref2 to the sub-DAC 310_2. Such adjustments to the gain provided by the sub-DAC 310_2 are made in an effort to cause the light output by the green laser diode 412 to be within a specified tolerance of a predetermined amount of light which is desired when that specific digital signal is provided to the input of the DAC $409_2$. This procedure is repeated for the additional sub-DACs of the DAC $409_2$, until all the sub-DACs are turned fully on and each of the sub-DACs has been calibrated.

This calibration procedure will now be summarized with reference to the high level flow diagram of FIG. 6. Such a calibration procedure is especially useful for calibrating a system that includes a digital to analog converter (DAC) including a plurality of sub-DACs, a light emitting element (e.g., a laser diode), and at least one photo-detector. In this system, the DAC is adapted to receive a multi-bit digital input and output an analog output current in response to and indicative of the digital input received by the DAC. Currents output by the sub-DACs are combined to provide the analog output current that is output by the DAC. Further, the light emitting element (e.g., the laser diode) is adapted to be driven in dependence on the analog output current output by the DAC.

Referring to FIG. 6, at step 602 a count (N) is initialized to equal 1. At step 604, the DAC is provided with a predetermined digital input that causes the Nth least significant one of the sub-DACs to be turned fully on, all less significant ones of the sub-DACs, if any, to also be turned fully on, and all more significant ones of the sub-DACs, if any, to be turned fully off. At step 606, a portion of the light produced by the light emitting element, in response to the predetermined digital input provided to the DAC at step 604, is detected to produce a signal indicative of an amount of light output by the light emitting element. At step 608, a gain of the most significant one of the sub-DACs that is turned fully on is adjusted so that the amount of light output by the light emitting element is within a specified tolerance of a predetermined amount of light which is desired when the predetermined digital input is provided to the DAC at step 604.

At step 610, N is incremented so that N=N+1. At step 612, N is compared to the total number of sub-DACs in the DAC. If N is not greater than the total number of sub-DACs, then flow returns to step 604. If N is greater than the total number of sub-DACs, then the calibration procedure ends.

In accordance with an embodiment, the predetermined digital inputs provided to the DAC at step 604 are programmed into the system. In an embodiment, the gains of the sub-DACs are adjusted at step 608 by modifying digital values stored in gain control registers of the system.

The above described calibration procedure can be automatically performed at power-up of a projector and thereafter from time to time (e.g., once every few millisecond), and can be performed during one or more blanking periods of a video signal.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A digital to analog converter (DAC), comprising:
a DAC input adapted to receive a multi-bit digital input;
a DAC output adapted to output an analog output current in response to and indicative of the digital input;
a plurality of sub-DACs; and
a plurality of gain control registers comprising a separate gain control register corresponding to each of the plurality of sub-DACs;
wherein currents output by the sub-DACs are combined to provide the analog output current that is output at the DAC output;
wherein each said sub-DAC is adapted to receive a separate reference current that specifies a transfer function of the sub-DAC; and
wherein a transfer function of the DAC is modifiable in a piece-wise linear manner by modifying one or more digital values stored in the gain control registers, which modifies one or more of the reference currents provided to the sub-DACs.

2. A digital to analog converter (DAC), comprising:
a DAC input adapted to receive a multi-bit digital input;
a DAC output adapted to output an analog output current in response to and indicative of the digital input;
a plurality of sub-DACs;
a separate gain-DAC corresponding to each of the plurality of sub-DACs;
wherein currents output by the sub-DACs are combined to provide the analog output current that is output at the DAC output;
wherein each said sub-DAC is adapted to receive a separate reference current that specifies a transfer function of the sub-DAC;
wherein a magnitude of the reference current provided to each said sub-DAC is separately programmable to thereby separately control a gain of each said sub-DAC;
wherein each gain-DAC provides the reference current to its corresponding sub-DAC; and
wherein each gain-DAC receives at its input a digital value that specifies the magnitude of the reference current that the gain-DAC provides to its corresponding sub-DAC.

3. The DAC of claim 2, further comprising:
registers adapted to store a separate digital value for each of the gain-DACs;
wherein the stored digital values are used by the gain-DACs to generate the reference currents that are provided to the sub-DACs.

4. The DAC of claim 3, wherein a change to a digital value stored for one of the gain-DACs changes the reference current produced by the one of the gain-DACs, which changes the gain of the sub-DAC that receives the changed reference current.

5. The DAC of claim 4, wherein a transfer function of the DAC can be modified in a piece-wise linear manner by modifying one or more of the digital values stored in the registers, which modifies one or more of the reference currents provided by the gain-DACs to the sub-DACs.

6. A digital to analog converter (DAC), comprising:
a DAC input adapted to receive a multi-bit digital input;
a DAC output adapted to output an analog output current in response to and indicative of the digital input;
a plurality of sub-DACs;
a threshold-DAC adapted to produce an analog threshold current that is added to currents output by the sub-DACs to provide the analog output current that is output at the DAC output; and
one or more registers adapted to store a digital value that the threshold-DAC converters to the analog threshold current;
wherein each said sub-DAC is adapted to receive a separate reference current that specifies a transfer function of the sub-DAC;
wherein a magnitude of the reference current provided to each said sub-DAC is separately programmable to thereby separately control a gain of each said sub-DAC; and
wherein the threshold-DAC adds an offset to a transfer function of the DAC.

7. A method for performing a digital to analog conversion using a digital to analog converter (DAC) including a plurality of sub-DACs, comprising:
specifying a piece-wise linear transfer function for the DAC by specifying a separate transfer function for each of the sub-DACs, wherein specifying a separate transfer function of each of the sub-DACs comprises providing a separate reference current to each of the sub-DACs by storing a separate gain value for each of the sub-DACs;
receiving, at an input of the DAC, a multi-bit digital input;
selectively turning on one or more of the sub-DACs, or portions thereof, based on the received digital input, to thereby produce one or more currents at outputs of the sub-DACs; and
producing, at an output of the DAC, an analog output indicative of the digital input, by combining the currents produced by the sub-DACs.

8. A method for performing a digital to analog conversion using a digital to analog converter (DAC) including a plurality of sub-DACs, comprising:
specifying a transfer function of each of the sub-DACs by providing a separate reference current to each of the sub-DACs, wherein a magnitude of the reference current provided to each said sub-DAC is separately programmable;
receiving, at an input of the DAC, a multi-bit digital input;
selectively turning on one or more of the sub-DACs, or portions thereof, based on the received digital input, to thereby produce one or more currents at outputs of the sub-DACs;
producing, at an output of the DAC, an analog output indicative of the digital input, by combining the currents produced by the sub-DACs;
storing a separately programmable digital value for each of the sub-DACs; and
separately producing each of the reference currents by separately converting each of the programmable digital values into one of the reference currents using a separate gain-DAC.

9. The method of claim 8, wherein the DAC has a piece-wise linear transfer function defined by the transfer functions of the plurality of sub-DACs, and further comprising:
modifying the piece-wise linear transfer function of the DAC by modifying one or more of the separately programmable digital values.

10. The method of claim 8, further comprising:
modifying the gain of one of the sub-DACs by modifying the digital value stored for the one of the sub-DACs.

11. The method of 10, further comprising:
separately modifying the gain of another one of the sub-DACs by modifying the digital value stored for the another one of the sub-DACs.

12. A system, comprising:
a plurality of digital to analog converters (DACs) each of which is adapted to receive a separate multi-bit digital input and output a separate analog output current in response to and indicative of the digital input received by the DAC;
a plurality of light emitting elements, each of which produces light of a different wavelength, and each of which is adapted to be driven in dependence on one of the analog output currents output by one of the DACs;
wherein at least one said DAC includes a plurality of sub-DACs;
wherein currents output by the sub-DACs are combined to provide the analog output current that is output by the said DAC;
wherein each said sub-DAC is adapted to receive a separate reference current that specifies a transfer function of the sub-DAC; and
wherein a magnitude of the reference current provided to each said sub-DAC is separately programmable to thereby separately control a gain of each said sub-DAC.

13. The system of claim 12, wherein the plurality of light emitting elements include a red laser diode, a green laser diode and a blue laser diode.

14. The system of claim 13, further comprising:
one or more photo-detectors adapted to detect a portion of the light produced by at least the green laser diode and to produce a signal indicative of the light output by the green laser diode.

15. The system of claim 14, wherein a said DAC that produces the analog output current, in dependence on which the green laser diode is driven, comprises a said plurality of said sub-DACs.

16. The system of claim 15, further comprising:
registers adapted to store digital values in dependence on which are produced the reference currents provided to the said sub-DACs of the said DAC that produces the analog output current, in dependence on which the green laser diode is driven;
wherein the stored digital values are adapted to be automatically modified so that a desired transfer function is achieved for the light output by the green laser diode.

17. The system of claim 16, further comprising:
a plurality of gain-DACs adapted to convert the digital values stored in said registers to the reference currents provided to said sub-DACs of the said DAC that produces the analog output current, in dependence on which the green laser diode is driven.

18. The system of claim 12, wherein the said DAC that produces the analog output current, in dependence on which the green laser diode is driven, further comprises:

a threshold-DAC adapted to produce an analog threshold current that is added to the currents output by said sub-DACs to produce that analog output current in dependence on which the green laser diode is driven; and one or more registers adapted to store a digital value that the threshold-DAC converters to the analog threshold current.

19. A method for performing a calibration of a system including a digital to analog converters (DAC) including a plurality of sub-DACs, a light emitting element, and at least one photo-detector, wherein the DAC is adapted to receive a multi-bit digital input and to output an analog output current in response to and indicative of the digital input received by the DAC, wherein currents output by the sub-DACs are combined to provide the analog output current that is output by the DAC, and wherein the light emitting element is adapted to be driven in dependence on the analog output current output by the DAC;

wherein the method comprises:

(a) providing the DAC with a predetermined digital input that causes at least one of the sub-DACs to be turned fully on, all less significant ones of the sub-DACs, if any, to also be turned fully on, and all more significant ones of the sub-DACs, if any, to be turned fully off;

(b) detecting a portion of the light produced by the light emitting element, in response to the predetermined digital input provided to the DAC at step (a), to produce a signal indicative of an amount of light output by the light emitting element; and (c) adjusting a gain of the most significant one of the sub-DACs that is turned fully on so that the amount of light output by the light emitting element is within a specified tolerance of a predetermined amount of light which is desired when the predetermined digital input is provided to the DAC at step (a).

20. The method of claim 19, wherein:

steps (a), (b) and (c) are preformed for each of the sub-DACs of the DAC each time a calibration of the system is to be performed;

a first time steps (a), (b) and (c) are performed, during a said calibration, only the least significant one of the sub-DACs is turned fully on and all of the more significant ones of the sub-DACs are turned fully off;

a second time steps (a), (b) and (c) are performed, during the said calibration, only the first and second least significant ones of the sub-DACs are turned fully on and all of the more significant ones of the sub-DACs are turned fully off; . . .

a Mth time steps (a), (b) and (c) are performed, during the said calibration, the M least significant ones of the sub-DACs are turned fully on and all of the more significant ones of the sub-DACs are turned fully off; . . . and a last time steps (a), (b) and (c) are performed, during the said calibration, all of the sub-DACs are turned fully on.

21. The method of claim 19, wherein:

the predetermined digital inputs provided to the DAC at step (a) are programmed into the system; and the gains of the sub-DACs are adjusted at step (c) by modifying digital values stored in registers of the system.

22. The method of claim 21, wherein the method is automatically performed by the system.

23. The method of claim 21, wherein the method is performed during blanking periods of a video signal provided to the system.

24. A method for performing a digital to analog conversion using a digital to analog converter (DAC) including a plurality of sub-DACs, comprising:

specifying a separate transfer function of each of the sub-DACs by providing a separate reference current to each of the sub-DACs, wherein a magnitude of the reference current provided to each said sub-DAC is separately programmable;

receiving, at an input of the DAC, a multi-bit digital input;

selectively turning on one or more of the sub-DACs, or portions thereof, based on the received digital input, to thereby produce one or more currents at outputs of the sub-DACs;

producing an analog threshold current; and producing, at an output of the DAC, an analog output indicative of the digital input plus an offset, by combining the currents produced by the sub-DACs and the analog threshold current.

* * * * *